US007227766B2

(12) United States Patent
Arsovski et al.

(10) Patent No.: US 7,227,766 B2
(45) Date of Patent: Jun. 5, 2007

(54) MISMATCH-DEPENDENT POWER ALLOCATION TECHNIQUE FOR MATCH-LINE SENSING IN CONTENT-ADDRESSABLE MEMORIES

(75) Inventors: Igor Arsovski, South Burlington, VT (US); Ali Sheikholeslami, Toronto (CA)

(73) Assignee: MOSAID Technologies Incorporated, Kanata, Ontario (CA)

( * ) Notice: Subject to any disclaimer, the term of this patent is extended or adjusted under 35 U.S.C. 154(b) by 0 days.

(21) Appl. No.: 11/320,746

(22) Filed: Dec. 30, 2005

(65) Prior Publication Data

US 2006/0104100 A1    May 18, 2006

Related U.S. Application Data

(63) Continuation of application No. 10/702,489, filed on Nov. 7, 2003, now Pat. No. 7,006,368.

(60) Provisional application No. 60/424,314, filed on Nov. 7, 2002.

(51) Int. Cl.
  *G11C 15/00* (2006.01)
(52) U.S. Cl. .................. 365/49; 365/189.07; 365/203
(58) Field of Classification Search ................ 365/49, 365/189.07, 203
  See application file for complete search history.

(56) References Cited

U.S. PATENT DOCUMENTS 5,515,024 A * 5/1996 Ghia et al. ............... 340/146.2
5,602,150 A    2/1997 Lidsky 6,373,738 B1 * 4/2002 Towler et al. ................ 365/49
6,400,594 B2 * 6/2002 Hata et al. .................... 365/49

(Continued)

FOREIGN PATENT DOCUMENTS

CA    2 310 295    11/2001

OTHER PUBLICATIONS

Arsovski, I. et al. (2003). "A Current-Saving Match-Line Sensing Scheme for Content-Addressable Memories," 2003 *IEEE International Solid State Circuits Conference Session17*, Paper 17.3, 10 pages.

(Continued)

*Primary Examiner*—Connie C. Yoha
(74) *Attorney, Agent, or Firm*—Borden Ladner Gervais LLP

(57) ABSTRACT

A low power matchline sensing scheme where power is distributed according to the number of mismatching bits occurring on a matchline is disclosed. In particular, match decisions involving a larger number of mismatched bits consume less power compared to match decisions having a lesser number of mismatched bits. The low power matchline sensing scheme is based upon a precharge-to-miss sensing architecture, and includes a current control circuit coupled to each matchline of the content addressable memory array for monitoring the voltage level of the matchline during a search operation. The current control circuit provides a voltage control signal to the current source of the matchline to adjust the amount of current applied to the matchline in response to the voltage of the matchline. In otherwords, matchlines that are slow to reach the match threshold voltage due to the presence of one or more mismatching bits will receive less current than matchlines having no mismatching bits. Significant power reduction without compromising search speed is realized since matchlines carrying a match result are provided with the maximum amount of current.

11 Claims, 7 Drawing Sheets

U.S. PATENT DOCUMENTS

| | | | |
|---|---|---|---|
| 6,442,090 B1 | 8/2002 | Ahmed et al. | |
| 6,515,884 B1* | 2/2003 | Sywyk et al. | 365/49 |
| 6,522,562 B2 | 2/2003 | Foss | |
| 6,522,596 B2* | 2/2003 | Gillingham et al. | 365/227 |
| 6,538,947 B2 | 3/2003 | Ahmed et al. | |
| 6,584,003 B1* | 6/2003 | Kim et al. | 365/49 |
| 6,667,924 B2* | 12/2003 | Ahmed et al. | 365/207 |
| 6,717,876 B2* | 4/2004 | Vlasenko et al. | 365/207 |
| 6,804,133 B1* | 10/2004 | Khanna | 365/49 |
| 6,873,531 B2 | 3/2005 | Ahmed et al. | |
| 6,987,682 B2 | 1/2006 | Ma et al. | |

OTHER PUBLICATIONS

Arsovski, I. et al. (2003). "A Ternary Content-Addressable Memory (TCAM) Based on 4T Static Storage and Including A Current-Race Sensing Scheme," *IEEE Journal of Solid-State Circuits* 38(1):155-158.

Hsiao, I Y-L. et al. (2001). "Power Modeling and Low-Power Design of Content Addressable Memories," *IEEE* pp. IV-926-IV929.

Kobayashi, M. et al . (2000). "A Longest Prefix Match Search Engine for Multi-Gigabit IP Processing," *IEEE* pp. 1360-1364.

Lin, P-F. et al. (2001). "A 1-V 128-kb Four-Way Set-Associate CMOS Cache Memory Using Worldline-Oriented Tag-Compare (WLOTC) Structure With the Content-Addressable-Memory (CAM) 10-Transistor Tag Cell," *IEEE Journal of Solid-State Circuits* 36(4):666-675.

Miyatake, H. et al. (2001). "A Design for High-Speed Low-Power CMOS Fully Parallel Content-Addressable Memory Macros," *IEEE Journal of Solid-State Circuits* 36(6):956-968.

Shultz, K. J. et al. (1995). "Architectures for Large-Capacity CAMs," *INTEGRATION, The VLSO Journal* 18:151-171.

Shafai, F. et al. (1998) "Fully Parallel 30-MHz, 2.5-Mb CAMs," *IEEE Journal of Solid-State Circuits* 33 (11):1690-1696.

Thirugnaman, G. et al. (2001). "A Novel Low Power CAM Design," *Proceedings of the 14th Annual IEEE ASIC/SOC Conference*, pp. 198-202.

Zukowski, C. A. et al. (1997). "Use of Selecive Precharge for Low-Power-Content-Addressable Memories," *IEEE International Symposium on Circuits and Systems* pp. 1788-1791.

* cited by examiner

US 7,227,766 B2

MISMATCH-DEPENDENT POWER ALLOCATION TECHNIQUE FOR MATCH-LINE SENSING IN CONTENT-ADDRESSABLE MEMORIES

CROSS-REFERENCE TO RELATED APPLICATIONS

This application is a continuation of U.S. patent application Ser. No. 10/702,489, filed Nov. 7, 2003 now U.S. Pat. No. 7,006,368, which claims priority to U.S. Provisional Patent Application No. 60/424,314, filed Nov. 7, 2002, the contents of which are expressly incorporated herein by reference.

FIELD OF THE INVENTION

The present invention relates generally to content addressable memory. More particularly, the present invention relates to matchline sensing of content addressable memory arrays.

BACKGROUND OF THE INVENTION

An associative memory system called Content Addressable Memory (CAM) has been developed to permit its memory cells to be referenced by their contents. Thus CAM has found use in lookup table implementations such as cache memory subsystems and is now rapidly finding use in networking system applications such as network address translation, pattern recognition, and data compression. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not.

A CAM stores data in a matrix of cells, which are generally either SRAM based cells or DRAM based cells. Until recently, SRAM based CAM cells have been most common because of their relatively simpler implementation than DRAM based CAM cells. However, to provide ternary state CAMs, ie. where each CAM cell can store one of three values: a logic "0", "1" or "don't care" result, ternary SRAM based cells typically require many more transistors than ternary DRAM based cells. As a result, ternary SRAM based cells have a much lower packing density than ternary DRAM based cells.

A typical DRAM based CAM block diagram is shown in FIG. 1. The CAM 10 includes a matrix, or array 25, of DRAM based CAM cells (not shown) arranged in rows and columns. A predetermined number of CAM cells in a row store a word of data. An address decoder 17 is used to select any row within the CAM array 25 to allow data to be written into or read out of the selected row. Data access circuitry such as bitlines and column selection devices, are located within the array 25 to transfer data into and out of the array 25. Located within CAM array 25 for each row of CAM cells are matchline sense circuits, which are not shown, and are used during search-and-compare operations for outputting a result indicating a successful or unsuccessful match of a search word against the stored word in the row. The results for all rows are processed by the priority encoder 22 to output the address (Match Address) corresponding to the location of a matched word. The match address is stored in match address registers 18 before being output by the match address output block 19. Data is written into array 25 through the data I/O block 11 and the various data registers 15. Data is read out from the array 25 through the data output register 23 and the data I/O block 11. Other components of the CAM include the control circuit block 12, the flag logic block 13, the voltage supply generation block 14, various control and address registers 16, refresh counter 20 and JTAG block 21.

The extensive use of CAM's in current applications inevitably results in a demand for higher density and higher speed CAM chips that consume minimal power. Unfortunately, higher density arrays and operating speeds are realized primarily at the expense of power. Although advanced semiconductor processes continue to shrink device geometries and reduce dynamic power dissipation, overall power consumption remains substantially constant due to increased leakage power. Hence, circuit techniques have been proposed in the prior art to reduce power consumption of CAM devices.

One technique for reducing matchline power consumption is to precharge all matchlines to a miss voltage level, such as ground, and self-time activation of matchline sense amplifiers using a reference matchline row hard wired to a hit, or match condition. This technique is disclosed in detail in commonly owned U.S. patent application Ser. No. 10/258,580 having publication number US20030161194A1. FIG. 2 is a general circuit schematic of a portion of a CAM array that can be used in array 25 of FIG. 1 to illustrate the operation of the precharge-to-miss matchline sensing scheme.

CAM array 25 is subdivided into the memory array portion 30 and matchline sense circuit portion 32. Only the two last logical rows of the memory array portion 30 and matchline sense circuit portion 32 is shown, and wordlines WL are intentionally omitted to simplify the schematic of FIG. 2. But it will be understood by those skilled in the art that typically, wordlines would run in parallel to the matchlines and each wordline would connect to all cells in that particular row. For ease of illustration, matchline sense circuit portion 32 has been split in to two sections at either side of memory array portion 30. The memory array portion 30 includes CAM cells 34, reference CAM cells 36, bitlines BLj, complementary bitlines BLj*, searchlines SLj, complementary searchlines SLj*, matchlines MLi, and reference matchline RML. CAM cells 34 and 36 are arranged in rows and columns, and can be any well known type of cell such as a DRAM or SRAM based CAM cell configured for binary or ternary data storage. CAM cells 34 of a row are connected to a common matchline MLi, and CAM cells 34 of a column are connected to a common pair of search lines SLj/SLj* and a common pair of bitlines BLj/BLj*, where i is an integer value between 0 and n, and j is an integer value between 0 and m. The bottom row of array 25 is a reference matchline row 38, having reference elements constructed and arranged identically to the elements of the regular row above it. Reference CAM cells 36 are connected to RML and are configured such that they never form a conduction path between RML and ground, and therefore will not affect the outcome of a compare operation.

Each sense circuit of matchline sense circuit portion 32 includes a current source 40, a comparator circuit 42, and n-channel precharge transistors 44. Current source 40 connected to VDD applies current to its respective matchline MLi in response to feedback control signal EN*, for raising the voltage potential of the matchline MLi. Precharge transistors 44 couple each matchline MLi to ground in response to a precharge signal PRE received at their gates. Matchlines MLi are connected to their respective comparator circuits 42, where each comparator circuit 42 generates a signal ML_OUTi. The output of NOR gate 46 is inverted by inverter 48 to generate active low enable signal EN*, which is received by all current sources 40. The sense circuit for the reference row 38 is identical to the sense circuit described above, however, signal RML_OUT from comparator 42 of reference row 38 is connected to one input of NOR gate 46, while the other input of NOR gate 46 is connected to precharge signal PRE.

In operation, the matchline sense circuit portion 32 is self-timed to reduce power consumption of the CAM chip through the feedback loop of RML_OUT, NOR gate 46, inverter 48 and current sources 40. After a matchline MLi is precharged to ground by precharge transistors 44, a search word is asserted on the searchlines SLj, and the current source 40 on matchline MLi turns on. If any cell 34 on the matchline MLi is in a mismatch condition, MLi is coupled to ground and comparator 42 generates a low logic level output. If all cells of a word are in a match condition, there will be no conduction path from MLi to ground, allowing a voltage potential to develop and be sensed by comparator 42 to generate a high logic level output. Reference matchline RML has reference cells 36 in which internal storage nodes are hardwired to a match condition, such that there can never be a current path between RML and ground, therefore always providing a match condition. The reference matchline sense circuit detects when the RML potential exceeds a certain predetermined voltage level, called the sense voltage threshold, in order to disable all the other current sources. In this way, each matchline MLi receives just enough current to detect a match condition, but no more, saving substantial power. Therefore, matchline power is saved since all matchlines are precharged to ground and the current sources are self-timed to turn off and stop applying current to the matchlines.

Currently, commercial CAMs are limited to 18 Mb of storage and 100 million searches per second on a 144-bit search word, at typically 5 Watts per CAM chip. Compared to the conventional memories of similar size, CAMs consume considerably larger power. This is partly due to the fully-parallel nature of the search operation, in which a search word is compared in parallel against every stored word in the entire CAM array. Statistically, since a CAM will have many more miss-matches than matches during search operations, there is a large amount of power wasted in the array in each search cycle. Furthermore, while it is desirable to reduce power consumption in the memory array during search operations, the performance or speed at which match results are provided should not be adversely impacted.

It is, therefore, desirable to provide a matchline sensing scheme that can reduce power consumption of the memory array while maintaining or improving matchline sensing performance.

SUMMARY OF THE INVENTION

It is an object of the present invention to obviate or mitigate at least one disadvantage of previous matchline sensing schemes. In particular, it is an object of the present invention to provide a matchline sensing scheme that allocates less power to mismatching matchlines while maximizing search speed for matchlines having a match condition.

In a first aspect, the present invention provides a content addressable memory having a matchline and a reference matchline. The content addressable memory includes a current source circuit coupled to the matchline for applying a variable current to the matchline in response to a first control signal, a first control circuit coupled to the matchline for sensing a voltage level of the matchline and generating the first control signal in response to the sensed voltage level and a second control signal, and a second control circuit coupled to the reference matchline for generating the second control signal.

According to an embodiment of the present aspect, the reference matchline is provided with a reference current source circuit and a reference first control circuit, where the reference current source circuit is substantially identical to the current source circuit and the reference first control circuit is substantially identical to the first control circuit. According to another embodiment, the second control circuit generates the second control signal in response to an output signal from the reference matchline and a matchline pre-charge signal. The second control signal can include an enable signal for enabling or disabling the current source circuit and the first control circuit. Furthermore, the second control circuit can include a third control circuit for modifying the output signal from the reference matchline.

In an aspect of the present embodiment, the third control circuit can include a delay circuit for delaying the output signal from the reference matchline, where the delay circuit can include a programmable delay circuit.

In a second aspect, the present invention provides a content addressable memory having an array of content addressable memory cells arranged in rows and columns, and a plurality of matchlines each coupled to a row of content addressable memory cells. The content addressable memory includes a circuit for providing current to the matchline, the circuit being controlled in response to a voltage level of the matchlines such that a variable current is applied to the matchline.

In a third aspect, the present invention provides a content addressable memory having an array of content addressable memory cells arranged in rows and columns, and a plurality of matchlines and a reference matchline each coupled to a row of content addressable memory cells. The content addressable memory includes a circuit for providing current to the matchline and adjusting the quantity of the current being provided to the matchline, the circuit being controlled by a first control signal from the matchlines and a second control signal from the reference matchline In an embodiment of the present aspect, the first control signal can include a voltage level sensed from the matchline, and the second control signal can include a signal generated in response to an output signal from the reference matchline and a matchline pre-charge signal. The output signal can be delayed through a delay circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A low power matchline sensing scheme where power is distributed according to the number of mismatching bits occurring on a matchline is disclosed. In particular, match decisions involving a larger number of mismatched bits consume less power compared to match decisions having a lesser number of mismatched bits. The low power matchline sensing scheme is based upon a precharge-to-miss sensing architecture, and includes a current control circuit coupled to each matchline of the content addressable memory array for monitoring the voltage level of the matchline during a search operation. The current control circuit provides a voltage control signal to the current source of the matchline to adjust the amount of current applied to the matchline in response to the voltage of the matchline. In otherwords, matchlines that are slow to reach the match threshold voltage due to the presence of one or more mismatching bits will receive less current than matchlines having no mismatching bits. Significant power reduction without compromising search speed is realized since matchlines carrying a match result are provided with the maximum amount of current.

Figure 1:
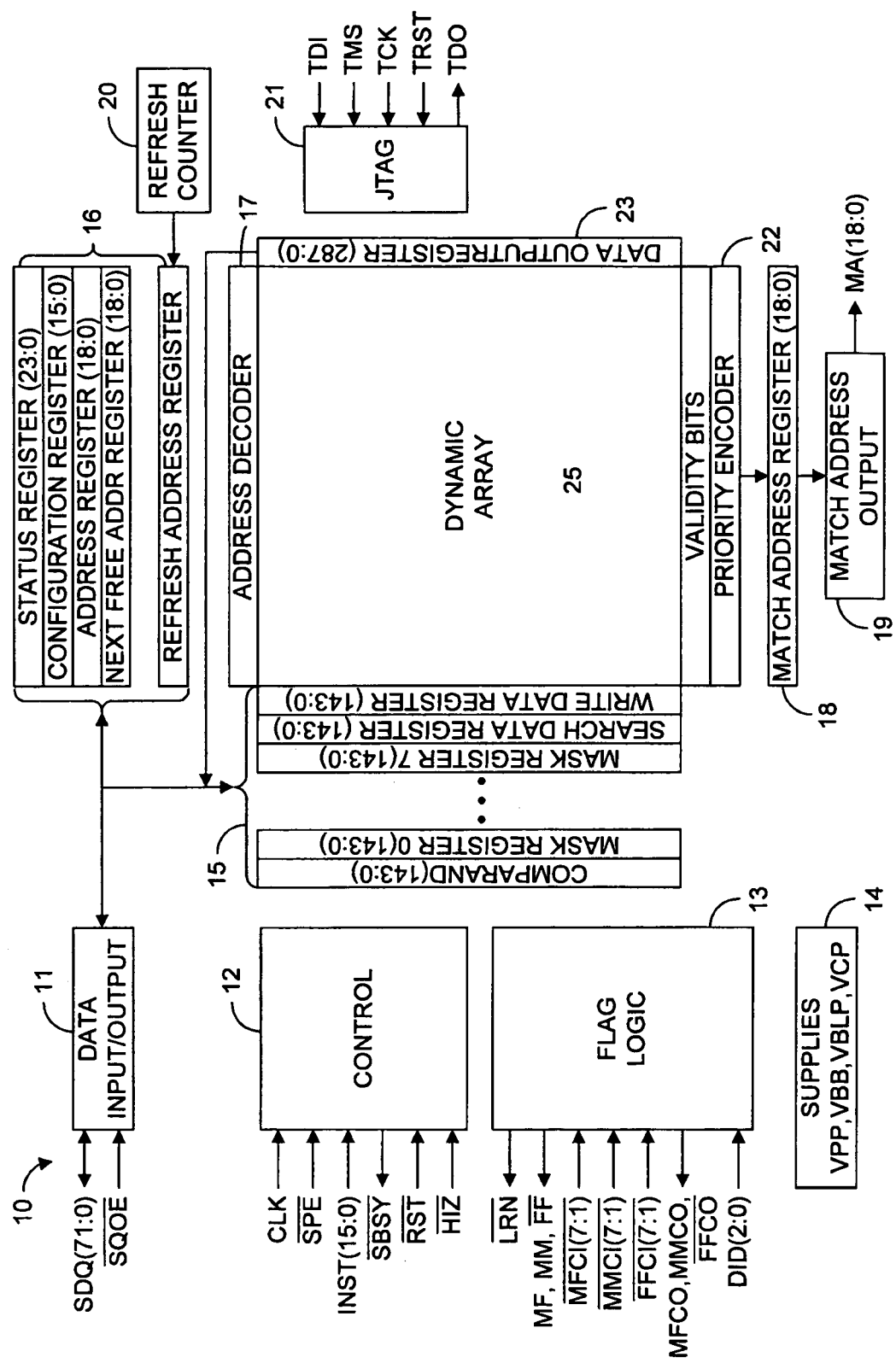
FIG. 1 is a block diagram of a typical DRAM based CAM chip.
Figure 2:
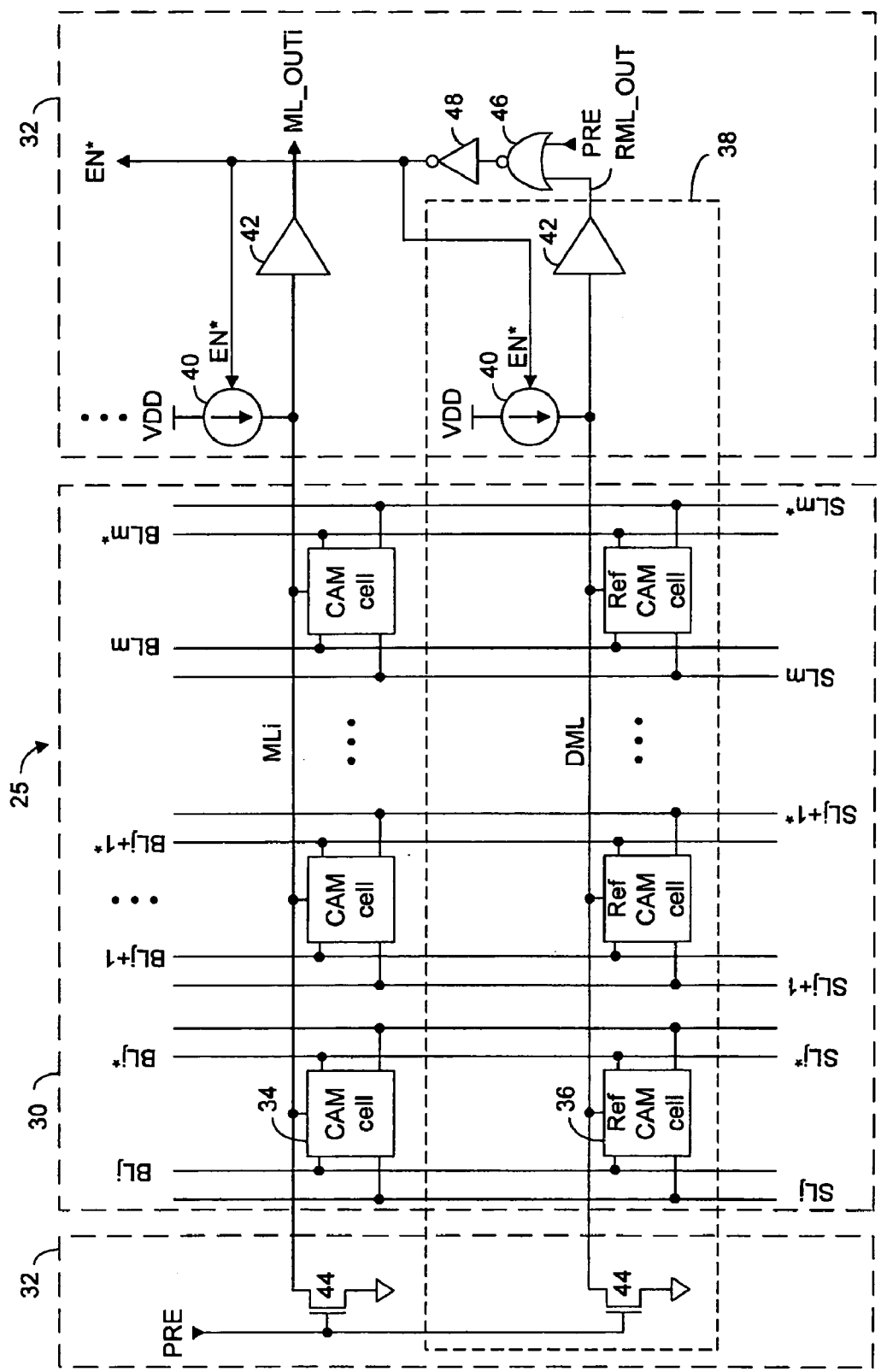
FIG. 2 is a circuit schematic of the memory array of FIG. 1.
Figure 3:
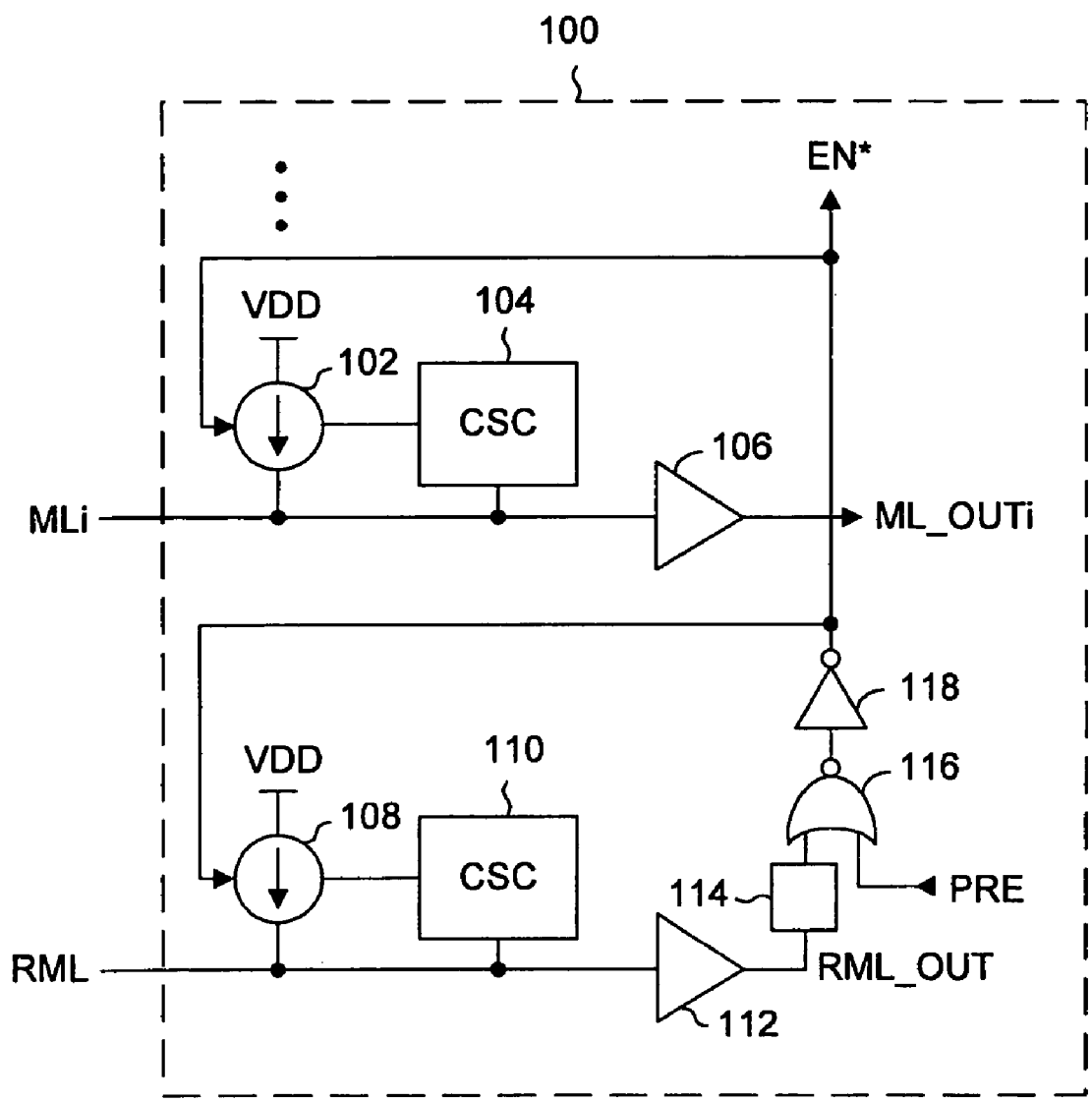
FIG. 3 is a circuit schematic of a matchline sense circuit according to an embodiment of the present invention.

FIG. 3 is a circuit schematic of a low power matchline sense circuit block 100 for use in the memory array 25 of FIGS. 1 and 2 according to an embodiment of the present invention. The low power matchline sense circuit block 100 of FIG. 3 is similar in configuration to the matchline sense circuit portion 32 shown in FIG. 2, but includes additional circuits to dynamically control the current source coupled to respective matchlines. Each matchline MLi has a low power matchline sense circuit which includes a voltage controlled current source 102 for applying current to a matchline, a current control circuit 104 coupled to the matchline and the voltage controlled current source 102, and a matchline sense amplifier 106 for sensing the voltage of the matchline and providing a match output signal ML_OUTi. Similarly, the reference matchline RML has a low power matchline sense circuit which includes a voltage controlled current source 108 for applying current to RML, a current control circuit 110 coupled to RML and the voltage controlled current source 108, and a matchline sense amplifier 112 for sensing the voltage of RML and providing a match output signal RML_OUT. RML_OUT is provided to an input of programmable delay circuit 114, which selectively provides a delayed RML_OUT to an input of NOR gate 116. Programmable delay circuit 114 is used to compensate for process variations, as will be discussed in detail later, but for the present discussion it is assumed that programmable delay circuit 114 is set to provide no delay of RML_OUT. The other input of NOR gate 116 receives precharge signal PRE, and the output of NOR gate 116 is inverted by inverter 118 to generate active low enable signal EN* fed back to all the voltage controlled current sources 102 and 108.

Generally, the current control circuit 104 dynamically monitors and senses the matchline voltage for applying an amount of current to the matchline through the voltage controlled current source 102. Hence, the current control circuit 104, the voltage controlled current source 102 and matchline form a positive feedback loop. Circuit details of the low power matchline sense circuit for one matchline is shown in FIG. 4.

Figure 4:
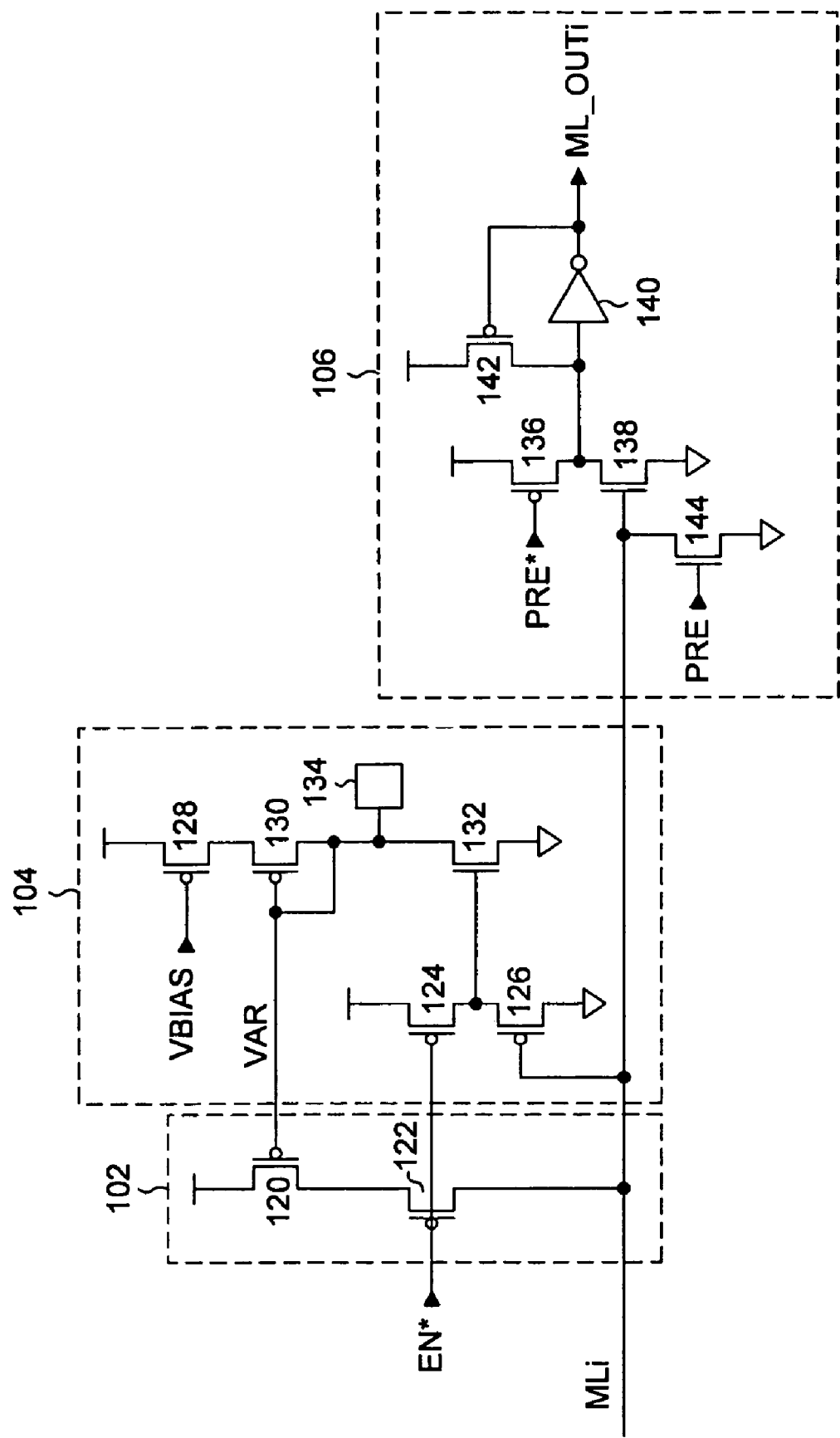
FIG. 4 is a detailed circuit schematic of the matchline sense circuit of FIG. 3 according to an embodiment of the present invention.

FIG. 4 is a circuit schematic of one matchline sense circuit of FIG. 4, showing the details of voltage controlled current source 102, current control circuit 104 and matchline sense amplifier 106 for matchline MLi, according to an embodiment of the present invention. It is noted that the voltage controlled current source 102, current control circuit 104 and matchline sense amplifier 106 are identical for all matchlines and for the reference matchline RML. Voltage controlled current source 102 applies variable current to MLi during a search operation, and includes a pair of p-channel transistors, 120 and 122, serially connected between VDD and the matchline MLi. The gate of transistor 120 receives voltage control signal VAR, and the gate of transistor 122 receives enable signal EN*. Transistor 120 provides a variable current in response to the voltage level of VAR, and transistor 122 functions as a digital switch for coupling the current from transistor 120 to MLi.

The current control circuit 104 monitors the voltage of the matchline MLi during a search operation, and adjusts the voltage level of control voltage VAR based upon the voltage level of MLi. The current control circuit 104 includes a level shift circuit consisting of p-channel transistors 124 and 126 serially connected between VDD and ground, and a dynamic bias voltage generator consisting of p-channel transistors 128, 130 and n-channel transistor 132 serially connected between VDD and ground, and a precharge circuit 134. The level shift circuit ensures that MLi voltages between ground and the Vtn of transistor 132 can be sensed to maintain the positive feedback loop by providing a level shifted MLi voltage. Alternatively, the level shift circuit is not required if transistor 132 is doped as a low threshold voltage transistor. The gate of transistor 124 receives enable signal EN*, and the gate of transistor 126 is connected to MLi. The gate of transistor 128 receives an on or off chip generated bias voltage VBIAS to control the current through transistor 128, the gate of transistor 130 is diode connected, and provides the VAR control voltage to transistor 120 of the voltage controlled current source 102, and the gate of transistor 132 is connected to the shared source/drain terminals of transistors 124 and 126. Those of skill in the art will recognize that transistors 120 and 130 are arranged in a current mirror configuration. While the precharge circuit 134 is shown connected to the dynamic bias voltage generator, it can alternatively be connected to the gate of transistor 120 of the voltage controlled current source 102. As will be discussed in further detail later, precharge circuit 134 can precharge VAR to a high voltage level to maximize power savings, to a low voltage level to maximize speed, or to any desired precharge voltage to obtain a desired balance between speed and power savings.

The matchline sense amplifier 106 senses the voltage level of MLi to provide a ML_OUTi signal indicative of a match or mismatch condition. In the present example, ML_OUTi at the high logic level represents a match condition, whereas ML_OUTi at the low logic level represents a mismatch condition. The matchline sense amplifier 106 can be implemented with any known or suitable circuit design, but is preferably a precharge to miss sense amplifier circuit for low power operation. In FIG. 4, the matchline sense amplifier circuit includes a p-channel transistor 136 and a p-channel transistor 138 serially connected between VDD and ground, and a half-latch circuit consisting of inverter 140 and p-channel transistor 142. The gate of transistor 136 receives active low precharge signal PRE* while the gate of transistor 138 is connected to MLi. The output of inverter 140 provides the match result output ML_OUTi. Matchline precharge transistor 144 functions identically to precharge transistor 44 of FIG. 2, and receives precharge signal PRE.

The operation of the low power matchline sense circuit block 100 of FIG. 3 during a search operation is now discussed with reference to FIG. 4. Prior to the search operation, a precharge phase commences with signal PRE driven to the high logic level and PRE* driven accordingly to the low logic level. In FIG. 3, the high logic level PRE causes inverter 118 to drive enable signal EN* to the high logic level. In FIG. 4, the high logic level PRE precharges matchline MLi to ground via transistor 144, and the low logic level PRE* turns on transistor 136 to drive ML_OUTi to the low logic level. Accordingly, RML_OUT is also driven to the low logic level. As the high logic level EN* signal turns off transistors 122 and 124, and MLi is at the low logic level, transistor 126 is turned on to couple the gate of transistor 132 to ground. With transistor 132 substantially off, the VAR node can be precharged to the high or low logic levels by precharge circuit 134, in response to either the active PRE or PRE* signals. For the purposes of low power operation, VAR is precharged to a high logic level, preferably VDD−Vtn such that a minimal initial current is provided by transistor 120.

To begin the search phase, search data is applied to the searchlines and PRE is driven to the low logic level. With both PRE and RML_OUT at the low logic level, EN* is driven to the low logic level by inverter 118 of FIG. 3 to enable all current sources 102, 108 and current control circuits 104, 110 via transistors 122 and 124 respectively. Therefore, all matchlines MLi begin charging with identical currents. For any given current, a matchline with a match condition will develop a higher voltage compared to a matchline having one or more mismatching bits, since the matchline with a match condition does not discharge its charge to ground. Conversely, a matchline with many mismatching bits will discharge much of its charge to ground, hence keeping its voltage level close to ground. With particular reference to FIG. 4, if MLi has many mismatching bits, the gate to transistor 126 remains close to ground, and as a result, pulls the gate of transistor 132 towards ground. With the current through transistor 132 restricted, the voltage level of VAR increases to restrict the current through transistor 120. Less current is then applied to MLi by voltage controlled current source 102.

In the case of a match condition on MLi, such as in the case of hardwired reference matchline RML, transistor 126 starts to shut off as RML quickly rises. Hence, transistor 124 drives the gate of transistor 132 towards VDD and current is drawn away from VAR to reduce its voltage level. As the voltage level of VAR drops, transistor 120 turns on harder to supply more current to RML. Since RML will reach the sense threshold voltage of transistor 138 before a matchline with at least one mismatching bit, the input of inverter 140 is coupled to ground and RML_OUT is driven to the high logic level. As shown in FIG. 3, RML_OUT at the high logic level results in EN* being driven to the high logic level to turn off all voltage controlled current sources and current control circuits. As RML_OUT simulates a match condition, all matchlines MLi having a match condition will have also reported a match condition on their respective ML_OUTi outputs by the time the voltage controlled current sources are turned off. The mismatching matchlines will not have had sufficient time to rise to the sense threshold voltage, and their respective ML_OUTi outputs will remain at the low logic level.

Statistically, since most matchlines are largely mismatched, significant current consumption is reduced during search operations. Furthermore, since current to a matchline having a match condition is maximized, a search speed equivalent to the sensing scheme of FIG. 2 is realized. The power savings realized by the low power matchline sensing scheme of the present embodiments is highlighted in the graph of FIG. 8.

Figure 8:
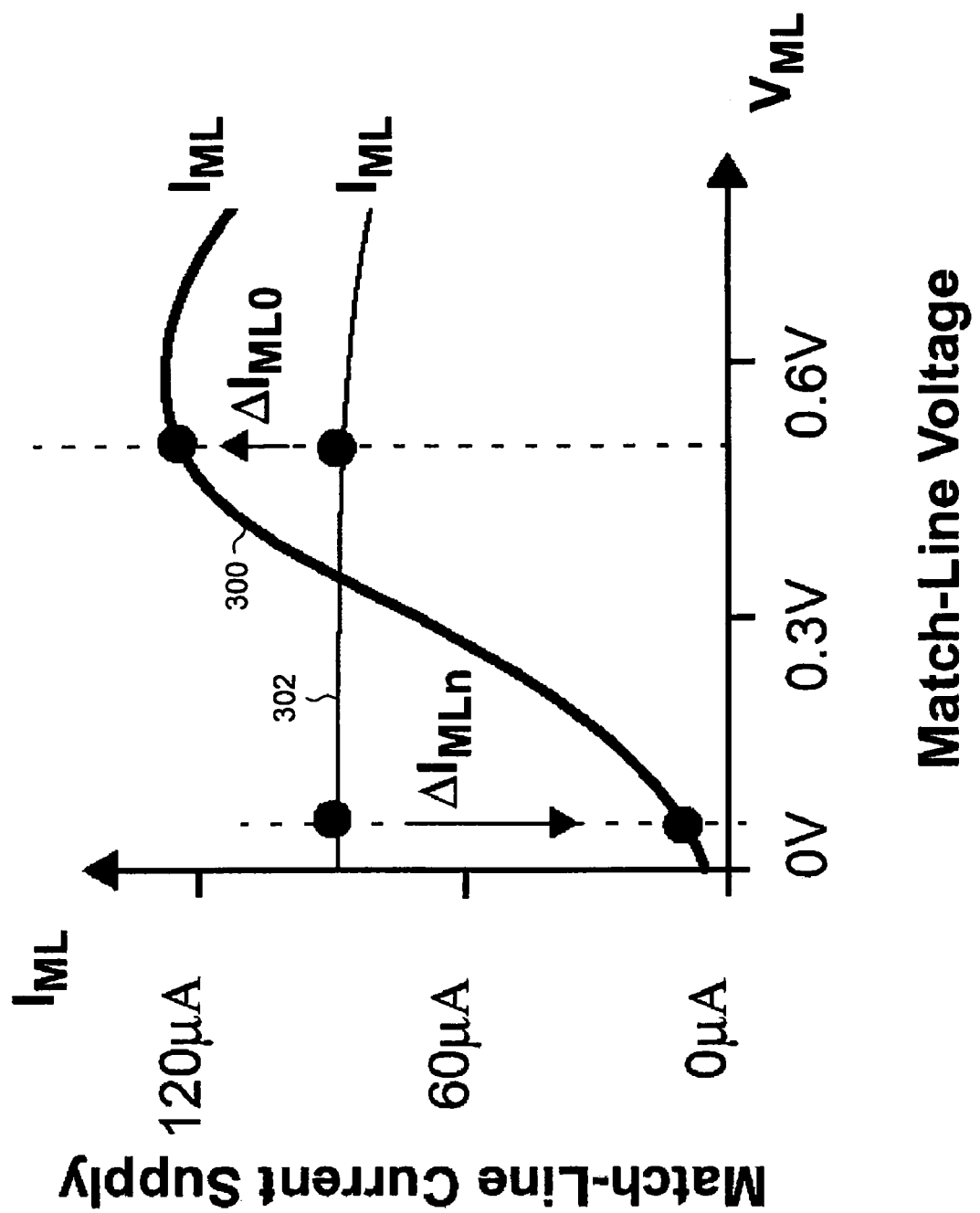
FIG. 8 is a plot showing the applied current to matchlines under the control of the current control circuit according to the embodiments of the present invention; and, FIG. 9 is a schematic of the programmable delay circuit of FIG. 3.

FIG. 8 is a plot of match line current $I_{ML}$ to matchline voltage $V_{ML}$ for a memory array using the low power matchline sensing scheme embodiments of the present invention, and for a memory array without any matchline sensing current control, such as the memory array 25 of FIG. 2. Curve 300 is the plot for current controlled matchline sensing and curve 302 is the plot for the non-current controlled matchline sensing. Plot 302 clearly shows that the matchline current remains substantially constant for matchline voltages between 0 and 0.5 volts. Hence, $I_{ML}$ is substantially independent of $V_{ML}$ for the entire sensing region, and large mismatches that stay close to ground receive the same amount of current as a matchline having a match condition which develops a much higher $V_{ML}$. For the current controlled matchline sensing scheme embodiments of the present invention, $I_{ML}$ of plot 300 starts small when $V_{ML}$ is close to ground, but rapidly rises as $V_{ML}$ increases. Therefore, large mismatches, which stay close to ground, receive a very small current, while matchlines having a match condition which ramp faster, receive more current as their $V_{ML}$ rises.

Figure 5:
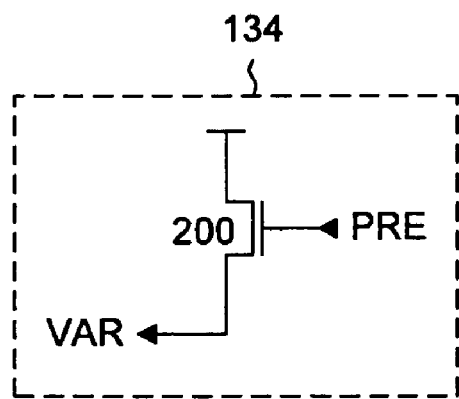
FIG. 5 is a circuit schematic of the precharge circuit of FIG. 4 according to an embodiment of the present invention.

The previously described embodiments of the invention assumed that current control circuit 104 of FIG. 4 was configured to precharge the VAR node to VDD−Vtn through precharge circuit 134 in order to minimize power consumption. As shown in FIG. 5, precharge circuit 134 can include an n-channel transistor 200 for coupling VDD to the VAR node in response to precharge signal PRE connected to its gate terminal. Therefore, when the search operation begins, all the voltage controlled current sources initially provide small currents to all the matchlines MLi, as illustrated in plot 300 of FIG. 8. Simulations between a 144-bit CAM word having a match condition and a seven bit mismatch using the low power sensing scheme embodiments of the present invention show that the mismatching matchline uses 62% less charge than the matchline with the match condition.

Figure 6:
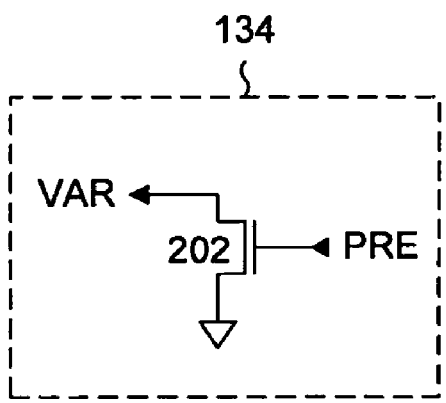
FIG. 6 is a circuit schematic of the precharge circuit of FIG. 4 according to another embodiment of the present invention.

In an alternative embodiment of the present invention shown in FIG. 6, precharge circuit 134 of current control circuit 104 can include an n-channel transistor 202 for coupling the VAR node to ground in response to precharge signal PRE connected to its gate terminal. By precharging VAR to ground, search speed is maximized as the initial current applied to the matchlines is maximized. In operation, a matchline with a match condition has a matchline voltage that rises very quickly to restrict the current through transistor 126 and consequently keep VAR close to ground.

Therefore the voltage level of VAR does not change significantly from the precharge level. On the other hand, a matchline with many mismatching bits will remain close to ground and turn on transistor 126, resulting in transistor 132 drawing less current from VAR. Hence the voltage level of VAR gradually increases to restrict the current through transistor 120. Simulations between a 144-bit CAM word having a match condition and a seven bit mismatch show that the mismatching matchline uses 48% less charge than the matchline with the match condition. Thus, higher speed operation over the precharge to VDD−Vtn configuration is gained at the expense of increased power consumption.

Figure 7:
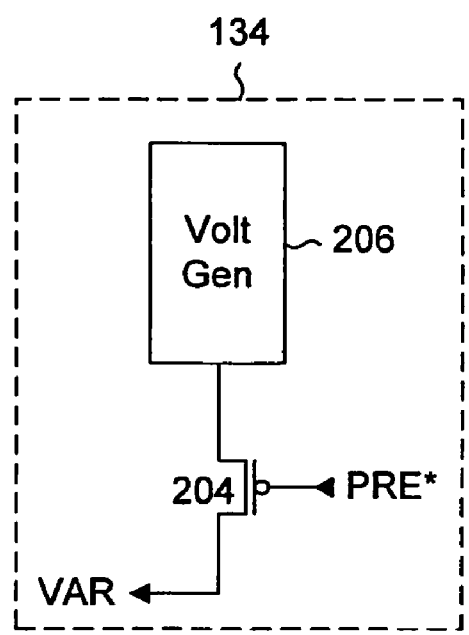
FIG. 7 is a circuit schematic of the precharge circuit of FIG. 4 according to another embodiment of the present invention.

In yet another embodiment of the present invention shown in FIG. 7, the VAR node can be precharged to a predetermined voltage level between VDD−Vtn and ground to optimize performance and minimum power consumption. The precharge circuit 134 of the present embodiment includes a p-channel transistor 204 that couples a variable voltage to the VAR node in response to active low precharge signal PRE* received at its gate terminal. The variable voltage is provided by voltage generator 206 that can be programmed or configured to provide different voltages. Voltage generators are well known in the art, and any suitable voltage generator circuit can be used for voltage generator 206.

In the presently discussed embodiments of the present invention, it is assumed that the CAM cells connected to the matchlines use n-channel search and compare transistors, also known as an NMOS search stack. In a further embodiment of the present invention, a CAM cell that uses a PMOS search stack, such as disclosed in commonly owned U.S. Pat. No. 6,522,562 can be used. In this embodiment, the matchline would be precharged to a miss voltage level of VDD and the voltage controlled current source is coupled between the matchline and ground. Such a circuit would resemble the one shown in FIG. 4, except that all the devices and power supplies would be inverted. In particular, all PMOS transistors would be replaced by NMOS transistors and all NMOS transistors would be replaced by PMOS transistors. The VDD and VSS connections would also be swapped.

The self-timed positive feedback, low power matchline sensing scheme embodiments of the present invention optimized for high speed operation can be sensitive to process variations between the RML circuits, responsible for timing, and normal matchline circuits which execute the word comparison. In particular, a matchline having a match condition can take longer to reach the sense threshold voltage than RML, and a matchline having a single bit mismatch can reach the sense threshold voltage faster than RML. In both cases, erroneous match results are output.

Figure 9:
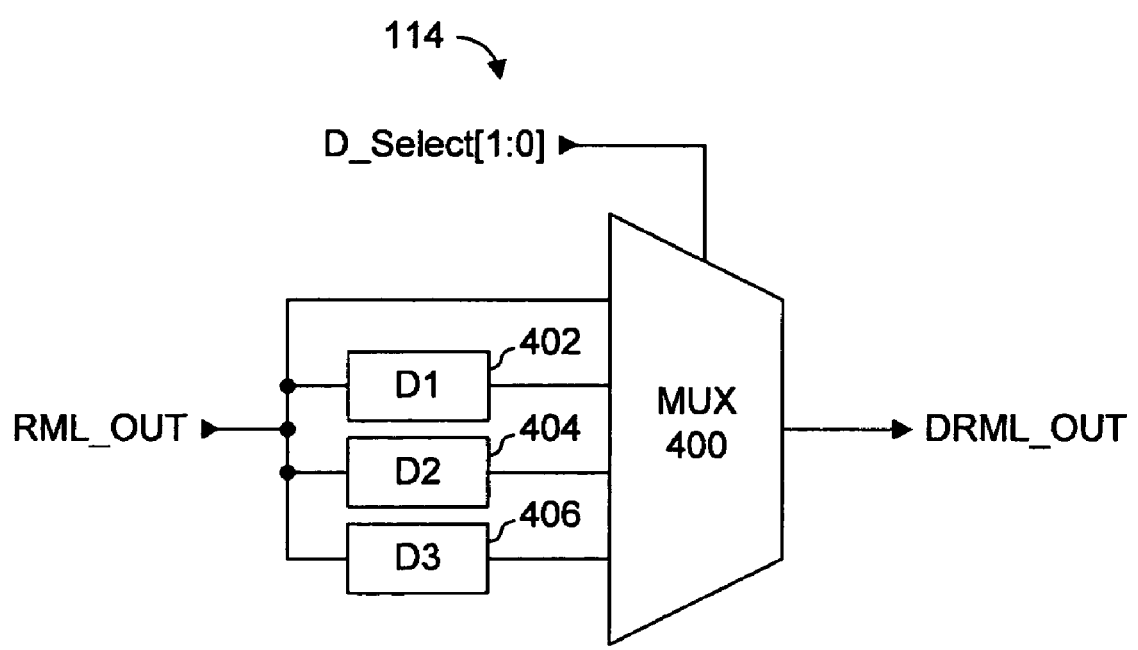

As previously shown in FIG. 3, the low power matchline sense circuit block 100 includes a programmable delay circuit 114. This programmable delay circuit 114 can be set to delay RML_OUT by a predetermined amount of time to compensate for matchlines having a match condition that develop their sense threshold voltage slower than RML. An embodiment of the programmable delay circuit 114 is shown in FIG. 9. Programmable delay circuit 114 includes a 4-1 multiplexor 400, a first delay block 402, a second delay block 404 and a third delay block 406. Signal RML_OUT generated from reference matchline sense amplifier 112 is provided in parallel to one input of multiplexor 400, and to the inputs of delay blocks 402, 404 and 406. The outputs of delay blocks 402, 404 and 406 are respectively connected to the remaining three inputs of multiplexor 400. A two bit selection signal D Select[0:1] is used to select one of the four inputs to pass to the multiplexor 400 output DRML_OUT. Each delay block can include any type and combination of delay elements, such as capacitors, resistors and inverter circuits known to those of skill in the art. In the present example, delay blocks 402, 404 and 406 each provides a different preset delay. Of course, a person of skill in the art should understand that any number of delay blocks with the appropriate multiplexor circuit can be used to set the required delay. Furthermore, programmable delay circuits are well known in the art, and can be used in the embodiments of the low power matchline sensing scheme embodiments of the present invention. Once the proper delay is selected, matchlines having a match condition will develop a matchline voltage that crosses the sense threshold voltage before enable signal EN* is driven to the inactive high logic level.

To compensate for single bit mismatching matchlines that develop a sense threshold matchline voltage before the voltage controlled current sources are disabled, the voltage controlled current source can be sized such that the largest process variations will never cause a matchline having a single bit mismatch to be sensed as a matchline having a match condition. For example, the channel lengths of one or both transistors 120, 122 of the voltage current source 102 can be increased such that the maximum voltage developed by a matchline having a single bit mismatch will be less than the lowest sense threshold voltage for all process variations.

Further compensation and control over the performance of the low power matchline sense scheme can be achieved by controlling the bias voltage VBIAS received by the current control circuit 104. In particular, VBIAS can be decreased to increase VAR for restricting the amount of current applied to the fast matchlines and reduce the speed at which their matchline voltages rise to the sense threshold voltage. Accordingly, less power is used when VBIAS is decreased, and more power is used when VBIAS is increased. Therefore, by controlling VBIAS, either on or off chip, high speed performance, minimum power consumption, and process variation compensation control is realized. Manufacturing yield can be increased because chips often discarded as a result of their process variation can be salvaged by adjusting their VBIAS setting.

The embodiments of the low power matchline sensing scheme discussed above allocate power to match decisions based on the number of mismatched bits in each CAM word. Because less power is allocated to mismatched matchlines and with most matchlines being in this category, this scheme results in a considerable power reduction. In addition, the present embodiments are configurable to maximize search speed and power savings, and configurable to compensate for 'fast' and 'slow' matchlines resulting from process variations.

The above-described embodiments of the present invention are intended to be examples only. Alterations, modifications and variations may be effected to the particular embodiments by those of skill in the art without departing from the scope of the invention, which is defined solely by the claims appended hereto.

The invention claimed is:

1. A content addressable memory having a matchline and a reference matchline, the content addressable memory comprising:
   a) a current source circuit coupled to the matchline, the current source circuit applying a variable current to the matchline in response to a first control signal;
   b) a first control circuit coupled to the matchline, the first control circuit sensing a voltage level of the matchline and generating the first control signal in response to the sensed voltage level and a second control signal;

c) a second control circuit coupled to the reference matchline for generating the second control signal.

2. The content addressable memory as claimed in claim 1, wherein the reference matchline is provided with a reference current source circuit and a reference first control circuit, the reference current source circuit being substantially identical to the current source circuit and the reference first control circuit being substantially identical to the first control circuit.

3. The content addressable memory as claimed in claim 1, wherein the second control circuit generates the second control signal in response to an output signal from the reference matchline and a matchline pre-charge signal.

4. The content addressable memory as claimed in claim 3, wherein the second control signal includes an enable signal for enabling or disabling the current source circuit and the first control circuit.

5. The content addressable memory as claimed in claim 3, wherein the second control circuit includes a third control circuit for modifying the output signal from the reference matchline.

6. The content addressable memory as claimed in claim 5, wherein the third control circuit includes a delay circuit for delaying the output signal from the reference matchline.

7. The content addressable memory as claimed in claim 6, wherein the delay circuit includes a programmable delay circuit.

8. A content addressable memory having an array of content addressable memory cells arranged in rows and columns, and a plurality of matchlines each coupled to a row of content addressable memory cells, the content addressable memory comprising a circuit for providing current to the matchline, the circuit being controlled in response to a voltage level of the matchlines such that a variable current is applied to the matchline.

9. A content addressable memory having an array of content addressable memory cells arranged in rows and columns, and a plurality of matchlines and a reference matchline each coupled to a row of content addressable memory cells, the content addressable memory comprising a circuit for providing current to the matchline and adjusting the quantity of the current being provided to the matchline, the circuit being controlled by a first control signal from the matchlines and a second control signal from the reference matchline.

10. The content addressable memory as claimed in claim 9, wherein the first control signal includes a voltage level sensed from the matchline, and the second control signal includes a signal generated in response to an output signal from the reference matchline and a matchline pre-charge signal.

11. The content addressable memory as claimed in claim 10, wherein the output signal is delayed through a delay circuit.

* * * * *